United States Patent [19]

Voss

[11] Patent Number: 4,897,706

[45] Date of Patent: Jan. 30, 1990

[54] THYRISTOR PROTECTED AGAINST BREAKOVER FIRING

[75] Inventor: Peter Voss, Munich, Fed. Rep. of Germany

[73] Assignee: Siemens Akiengesellschaft, Berlin and Munich, Fed. Rep. of Germany

[21] Appl. No.: 285,488

[22] Filed: Dec. 16, 1988

[30] Foreign Application Priority Data

Dec. 17, 1988 [DE] Fed. Rep. of Germany ....... 3742895

[51] Int. Cl.$^4$ ...................... H01L 29/74; H03K 3/26; H03K 3/35
[52] U.S. Cl. ..................................... 357/38; 307/303; 307/305
[58] Field of Search ........................... 357/38, 303, 305

[56] References Cited

U.S. PATENT DOCUMENTS

| | | | |
|---|---|---|---|
| 3,896,476 | 7/1975 | Kawakami | 357/38 |
| 4,012,761 | 3/1977 | Ferro et al. | 357/38 |
| 4,087,834 | 5/1978 | Temple | 357/38 |
| 4,314,266 | 2/1982 | Temple | 357/38 |

FOREIGN PATENT DOCUMENTS 1417953 12/1975 United Kingdom ................. 357/38

Primary Examiner—Andrew J. James
Assistant Examiner—Courtney A. Bowers
Attorney, Agent, or Firm—Jeffrey P. Morris; David N. Caracappa

[57] ABSTRACT

A thyristor protected against breakover firing is disclosed which has a region which, in comparison to the remaining semiconductor body, has a lower breakdown voltage. This region is provided with an auxiliary electrode and is separated from the remaining semiconductor body by a trench. Upon onset of the avalanche breakdown in the blocking direction, a voltage greater by 0.5 V, compared to the first emitter electrode, can build up at the auxiliary electrode without the thyristor firing. The auxiliary electrode is connected via a resistor with the first emitter electrode of the thyristor. In addition, between the auxiliary electrode and the control electrode a breakover element is interconnected which conducts at a given voltage drop across the resistor and initiates the firing process of the thyristor.

8 Claims, 1 Drawing Sheet

THYRISTOR PROTECTED AGAINST BREAKOVER FIRING

The invention relates to a thyristor which is not adversely affected by breakover firing.

It is known that a thyristor may fire, even without a control pulse applied at the control electrode, if the anode-cathode voltage becomes greater than the breakover voltage typical for the particular thyristor. This is referred to as "breakover firing". Breakover firing should be avoided for conventional thyristors since, in this firing process, the thyristor is exposed to unfavorable switch-on conditions. The current through the thyristor starts passes initially through a small area in the semiconductor body making up the thyristor. This area passes the entire load current until the firing process starting from this area has spread across the rest of the semiconductor body. This leads, in general, to local overheating and to possible destruction of the thyristor.

Thyristors are known for which breakover firing is possible without concomitant layer. These thyristors have a region which, compared to the rest of the semiconductor body, has a lower breakdown voltage. During voltage overload this region reaches breakdown first.

A disadvantage of such thyristors is that the switch-on region is endangered even if the region of lower breakdown voltage is within an auxiliary thyristor. This is because the switch-on region is frequently very small and relief through the main thyristor cannot take place rapidly enough.

An thyristor protected against breakover firing is described, for example, in DE-OS 23 00 754. FIG. 1 of this publication shows a semiconductor body forming a thyristor which has a main thyristor region and an auxiliary thyristor region. The main thyristor region is configured annularly around the auxiliary thyristor region which, again, is annular. Within the auxiliary thyristor region is disposed the region of lower breakdown voltage. This region consists of the first base zone, the second base zone, and the second emitter zone of the semiconductor body and has a lower breakdown voltage than the remaining semiconductor body. The first base zone is connected in this region with an auxiliary electrode which is connected via a resistor to the first emitter electrode of the main thyristor. The auxiliary thyristor region has, in addition, a separate control electrode for the conventional firing with control current. In breakover firing the avalanche current flows off first to the auxiliary electrode and via the resistor to the first emitter electrode of the main thyristor. In the thyristor configuration (cf. left arrow in FIG. 1) shown in FIG. 1 of DE-OS 23 00 754 a part of the current flows in the first base zone below the emitter zone of the auxiliary thyristor to the first emitter electrode of the main thyristor. In the presence of sufficiently high current the auxiliary thyristor fires which, in turn, supplies so much current to the main thyristor that it can fire linearly and destruction through breakover firing is avoided.

This known configuration, however, has the disadvantage that depending on the size of the resistor the triggering breakover firing current can be greater than the normal firing current of the auxiliary thyristor region if firing takes place with control current at the control electrode. In this way the region of lesser breakdown voltage can also assume a voltage limiter function without necessarily firing the thyristor.

Our invention is based on the task of describing an thyristor protected against breakover firing in which high breakover firing current reaches the control electrode of the thyristor, also with low dv/dt in comparison to the minimum triggering current, and thereby a large-area switch-on is achieved.

Below, the invention is described in fuller detail with reference to 3 Figures, in which.

Figure 1:
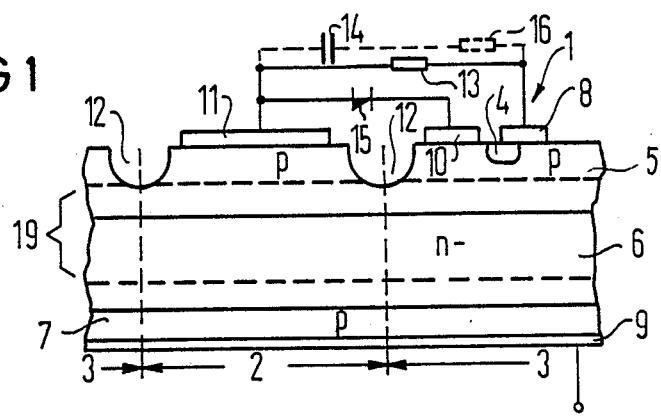
FIG. 1 is a sectional view through a first embodiment example according to the invention in which the region of lower breakdown voltage is disposed approximately centrally in the semiconductor body.

The thyristor shown in FIG. 1, and to be taken merely as embodiment example, has a semiconductor body 1 which has a first region 3 and a second region 2 which has a lower breakdown voltage than the first region 3. This second region 2 is disposed, for example, centrally in the interior of the semiconductor body 1 and is, for example, surrounded annularly by the first region 3. This first region 3 corresponds to the layer structure of a conventional thyristor. Region 3 has, at least partially, four zones above one another, of alternating conductivity type, of which the two outer zones form the first emitter zone 4 and the second emitter zone 7, respectively, while the two inner zones are the first base zone 5 and the second base zone 6. The assumption is made, in the representation according to FIG. 1, that the first emitter zone 4 is n-doped, the first base zone 5 p-doped, the second base zone 6 weakly n-doped, and the second emitter zone 7 p-doped. The first base zone 5, bordering on the first emitter zone 4, is connected to a control electrode 10. This control electrode 10 can also be the control electrode of an auxiliary thyristor integrated into the thyristor for firing augmentation. The first emitter zone 4 is connected to a first emitter electrode 8 and the second emitter zone 7 is connected to a second emitter electrode 9. The first emitter zone 4 has at least one shunt which is, for example, as shown in FIG. 1, either formed by the first emitter electrode 8 overlapping the first emitter zone 4 or by the first emitter zone 4 having short-circuit holes. The second region 2 has a three-layer structure, for example, a pnp structure. The first base zone 5 is connected within the second region 2 to an auxiliary electrode 11. In this embodiment example, the second region 2 of lower breakdown voltage is separated from the first region 3 by a trench 12. This trench 12 is at least so deep that it contacts the space charge zone when the avalanche breakdown starts in the blocking direction. This trench is also so deep that, in the event of a breakdown, it contacts the space charge zone 19 developing at the pn-junction between the two base zones 5 and 6. In the event of breakdown, the auxiliary electrode 11 is, thus, insulated from the first emitter electrode 8, the second emitter electrode 9, and the control electrode 10.

A resistor 13 is coupled between the auxiliary electrode 11 and the first emitter electrode 8. In addition, a breakover element 15, for example a breakover diode (BOD), is coupled between the auxiliary electrode 11 and the control electrode 10. The breakover element 15 conducts at a predetermined voltage drop across resistor 13. The control electrode 10 of the thyristor is, thereby, supplied with a control current and the firing process of the thyristor is initiated. The breakover voltage of the breakover element 15 may be between 0.5 volts and several hundred volts, depending on how much the breakdown voltage of the second region 2 and that of the first region 3 differ from each other and what breakdown currents are tolerated.

In operation, it may be assumed that, upon avalanche breakdown, a current flows of, for example, 1 A, and that resistor 13 has a value of 100 ohms. Thus, a voltage drop of 100 V appears across resistor 13. If the breakover element 15 has a breakover voltage of 100 V, then the breakover element 15 switches 1 A to the control electrode 10 of the thyristor. If, in addition, a capacitor 14 having a value of, for example 10 nF, is connected in parallel to resistor 13, then before breakover element 15 begins conducting, a charge of 1 $\mu$A-s is stored which leads to an increased firing current. The firing process is thereby further improved. In this embodiment example, a resistor 16 is connected in series with capacitor 14. It functions to attenuate the oscillation upon switch-on of the breakover element 15.

Figure 2:
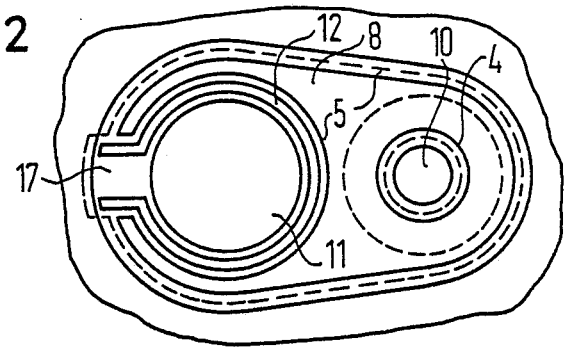
FIG. 2 is a top view of a thyristor with a semiconductor body according to FIG. 1 in which the resistor is integrated into the semiconductor body.

FIG. 2 shows the top view of the semiconductor body 1 represented in FIG. 1. Parts that are functionally equivalent to those in FIG. 1 are provided with identical reference numbers. The diameter of region 2 is the maximum diameter of the annular trench 12. The resistor 13 shown in FIG. 1 is integrated into the semiconductor body 1 and consists of a p-conducting layer which is in a recess of trench 12. This p-conducting layer is denoted by 17 in FIG. 2. The breakover element 15 is also integrable, for example as lateral thyristor, into the semiconductor body 1.

Figure 3:
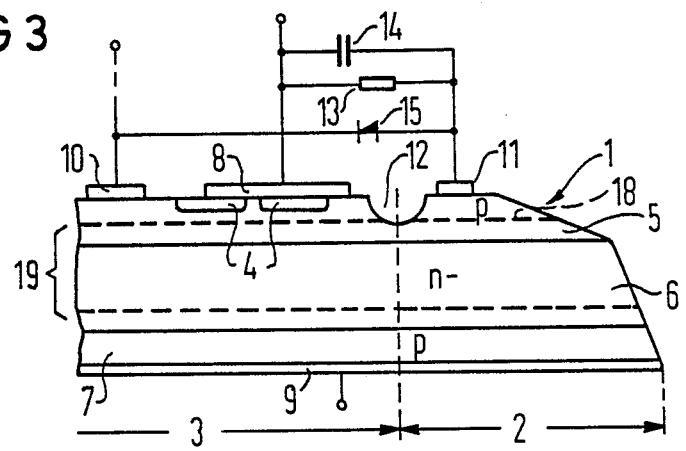
FIG. 3 is a sectional view of a second embodiment example according to the invention in which the weak rated area is disposed at the edge of the semiconductor body.

In FIG. 3 a further embodiment example for a thyristor with a semiconductor 1 and interconnections according to the invention is shown. Here too functionally identical parts are provided with the corresponding reference numbers. In contrast to the configuration shown in FIG. 2, the second region 2 of lower breakdown voltage is now disposed at edge 18 of the semiconductor body 1. The low breakdown voltage in FIG. 3 is generated in the blocking direction by the edge of the semiconductor body having a negative angle.

What I claim is:

1. A thyristor protected against breakover firing, including a semiconductor body having:
    a three-layer structure and, at least partially, four layers of alternating conductivity type of which the two outer layers are first and second emitter zones, respectively, and the two inner layers first and second base zones, respectively;
    a first region and a second region which has a lower breakdown voltage than the first region; wherein:
    the four layers reside at least partially in the first region;
    the first emitter zone is connected to a first emitter electrode;
    the second emitter zone is connected to a second emitter electrode;
    the first base zone, bordering on the first emitter zone, is connected to a control electrode;
    the first emitter zone has at least one shunt;
    the first base zone is connected to an auxiliary electrode in the second region;
    a resistor is coupled between the first emitter electrode and the auxiliary electrode;
    the second region is separated from the first region by a trench which is of such depth that it touches at least the space charge zone developing between the two base zones if the avalanche breakdown sets in in the blocking direction;
    a breakover element is coupled between auxiliary electrode and control electrode which conducts at a given voltage drop across the resistor and initiates the firing process of the thyristor.

2. The thyristor of claim 1, wherein a capacitor is connected in parallel with the resistor.

3. The thyristor of claim 1, wherein the series circuit of a capacitor with resistor is connected in parallel with resistor.

4. The thyristor of claim 1, wherein the breakover element is a diode.

5. The thyristor of claim 1, wherein the breakover element is a thyristor.

6. The thyristor of claim 1, wherein the resistor is integrated into the semiconductor body.

7. The thyristor of claim 1, wherein the first region surrounds the second region annularly.

8. The thyristor of claim 1, wherein the second region is disposed at the edge of the semiconductor body.

* * * * *

UNITED STATES PATENT AND TRADEMARK OFFICE
CERTIFICATE OF CORRECTION

PATENT NO. : 4,897,706

DATED : Jan. 30, 1990

INVENTOR(S) : Peter Voss

It is certified that error appears in the above-identified patent and that said Letters Patent is hereby corrected as shown below:

Cover Page

Section [30] delete "Dec. 17, 1988" and insert in its place --Dec. 17, 1987--.

Signed and Sealed this

First Day of January, 1991

Attest:

HARRY F. MANBECK, JR.

Attesting Officer

Commissioner of Patents and Trademarks